United States Patent
Hrassky

[11] Patent Number: 4,907,121
[45] Date of Patent: Mar. 6, 1990

[54] COMPARATOR WITH EXTENDED COMMON-MODE INPUT VOLTAGE RANGE

[75] Inventor: Petr Hrassky, Wasserburg, Fed. Rep. of Germany

[73] Assignee: SGS-Thomson Microelectronics GmbH, Grasbrunn, Fed. Rep. of Germany

[21] Appl. No.: 184,055

[22] Filed: Apr. 20, 1988

[30] Foreign Application Priority Data

Apr. 21, 1987 [DE] Fed. Rep. of Germany ....... 3713376

[51] Int. Cl.$^4$ .............................................. H01H 9/00
[52] U.S. Cl. .................................... 361/154; 307/360; 123/490
[58] Field of Search ................ 361/154, 187; 307/356, 307/358, 359, 360; 123/490

[56] References Cited
FOREIGN PATENT DOCUMENTS 2828678  4/1980  Fed. Rep. of Germany .
2841781  4/1980  Fed. Rep. of Germany .
2950692  7/1981  Fed. Rep. of Germany .
3402759  8/1985  Fed. Rep. of Germany .
57-74667 10/1982  Japan .

OTHER PUBLICATIONS

"Low-Voltage Operational Amplifier with Rail-to-- Rail Input and Output Ranges", Johan H. Huijsing and Daniel Linebarger, IEEE Journal of Solid–State Circuits, vol. SC-20, No. 6, Dec. 1985.

*Primary Examiner*—L. T. Hix
*Assistant Examiner*—David Gray
*Attorney, Agent, or Firm*—Dickstein Shapiro & Morin

[57] ABSTRACT

A comparator comprising two differential input stages (Q1 to Q4 and Q5 to Q8) which are connected in parallel and fed by a common constant circuit source ($Q_B$) whose current is passed either to both or only to the one or only to the other differential input stage, depending on whether the common-mode input voltage of the comparator is within, above or below a voltage range that is between the voltage values of the two poles (VC, VE) of a supply voltage source (B) of the comparator, and comprising a common current mirror circuit (Q9, Q10) which is associated with the outputs of both differential input stages and from which the comparator output signal is derived. At least one (Q1 to Q4) of the two differential input stages operates in common-base connection, with this differential input stage (Q1 and Q4) receiving its supply current from the common-mode input voltage source.

16 Claims, 5 Drawing Sheets

COMPARATOR WITH EXTENDED COMMON-MODE INPUT VOLTAGE RANGE

CROSS REFERENCE TO RELATED APPLICATION

The inventor herein is also the inventor of concurrently filed U.S. patent application Ser. No. 07/184,069 now abandoned entitled Switching Current Regulator.

BACKGROUND OF THE INVENTION

The invention relates to a comparator comprising two differential input stages connected in parallel, whose comparator inputs are connected to input voltage sources having a common-mode input voltage and which are fed by a common constant current source whose current is passed either to both or only to the one or only to the other differential input stage, depending on whether the common-mode input voltage of the comparator is within, above or below a voltage range that is between the voltage values of the two poles of a supply voltage source of the comparator, said comparator comprising furthermore a common current mirror circuit which is connected downstream of the outputs of both differential input stages and from which the comparator output signal is derived.

Comparators serve to compare two input voltages. This means, they evaluate the differential voltage present between their inverting and non-inverting inputs. However, they are not able to do this at any arbitrary common-mode input voltages. The reason therefor is that the comparator operates in the desired manner only when it works in its linear range. In usual comparators, the admissible common-mode input voltage range is between the supply voltage and ground and is smaller than the supply voltage present.

In many applications this admissible range of utilization of the common-mode input voltage is not sufficient. For instance, when the supply voltage of the supply voltage source is only 1.5 V, as is the case e.g. in electric wrist watches, there are only about 0.5 V left for the useful range of the common-mode input voltage.

A comparator of the type indicated at the outset is shown in FIG. 2 of the publication "Low-Voltage Operational Amplifier with Rail-to-Rail Input and Output Ranges" by Johan H. Huijsing, published in the IEEE Journal of Solid-State Circuits, Vol. SC-20, No. 6, December 1985, pages 1144 to 1150. By using two differential input stages connected in parallel, the one of which has a npn transistor pair in common-emitter connection and the other one of which has a pnp transistor pair in common-emitter connection, and by using a common constant current source whose current is passed, with the aid of a current diversion circuit, in the lower range of the common-mode input voltage to the one differential input stage, in the upper range of the common-mode input voltage to the other differential stage and in a middle transition range to both differential input stages, and by using a common current mirror which is biased by means of an additional voltage source and is coupled at both ends by means of resistors to the one and to the other differential input stage, respectively, one obtains the result that the admissible common-mode input voltage can be approx. 0.2 V below and above the supply voltage range.

However, there are applications necessitating a comparator which must still function at common-mode input voltages which by far exceed the supply voltage or are much lower than ground potential. An example of such an application is a switching current regulator for an inductive load, as it is shown in FIG. 1 as regards its circuit design and in FIGS. 2a to 2f as regards some voltage and current patterns. The exact mode of operation of this current regulator is described in the simultaneously filed German Patent Application P 37,13,377.2 which corresponds to U.S. patent application Ser. No. 07/184,069, now abandoned, filed concurrently herewith of the applicant, which is entitled "switching current regulator", so that a brief elucidation is sufficient herein.

As long as a transistor T is switched on, a load current $i_L$ flows through the inductive load having an inductivity L and a load resistance $R_L$, and through a sensor resistor $R_S$. When the transistor T is switched off, the load current $i_L$ flows through a flyback circuit FL having a diode D and a Zener diode Z. However, this flyback current can flow only when the negative voltage induced in the inductivity L as a consequence of the switching-off operation reaches the flyback voltage $U_{FL}$ of the flyback circuit FL, since only then will the diodes D and Z be conducting. During the flyback phase the output voltage $u_A$ at the output A, therefore, is equal to the sum of the supply voltage $U_B$ and the flyback voltage $U_{FL}$.

During the current regulation the Zener diode Z is bridged with the aid of a switch K so that only the relatively low forward voltage of the diode D is active for the flyback voltage, so that a slow current drop is obtained in the flyback phase. In order to achieve a rapid drop of the load current to zero after deactivation of the current regulator, one opens the switch K so that the sum of the Zener voltage and the diode forward voltage become active as flyback voltage then. During this flyback phase, the output voltage $u_A$ at the output A of the current regulator rises to values that are much higher than the supply voltage. When the current regulator is used, for instance, as a solenoid driver or magnetic valve driver in motor vehicles, rapid deactivation of the current regulator is effected by Zener diodes leading to a flyback voltage in the range of 20 V. In case of an application in the motor vehicle range, an operating voltage of up to 24 V is required. Thus, in the deactivation flyback phase one arrives at an output voltage $u_A$ in the range of 44 V.

This voltage which is far above the supply voltage $U_B$ must be processable as a common-mode input voltage by a comparator which compares the sensor voltage across $R_S$ with the reference voltage across $R_R$ and activates or deactivates the transistor T in accordance with the comparison result.

A comparator circuit of the type known from the publication indicated hereinbefore is far from being capable of handling such a common-mode input voltage.

SUMMARY AND OBJECTS OF THE INVENTION

It is the object of the invention to improve a comparator of the type indicated at the outset in such a manner that it can handle common-mode input voltages which are much higher than its supply voltage.

A solution to achieve this object is a comparator of the type indicated at the outset at least one of the two differential input stages of which operates in common-base connection and receives its emitter supply current from the input voltage sources. This comparator can be developed in advantageous manner in accordance with the dependent claims.

A solution to achieve this object is indicated in claim 1 and can be developed in advantageous manner in accordance with the dependent claims.

Due to the fact that according to the invention one of the two differential input stages comprises a transistor pair in common-base connection whose emitter terminals are connected to one each of the two comparator inputs, a comparator is provided whose common-mode input voltage may by far exceed the voltage value at least of the one pole of the supply voltage source. In this respect, the common-mode input voltage acts as supply voltage for the common-base connection differential input stage. The common-mode input voltage thus is limited only by the breakdown voltage as necessitated by manufacturing technology.

Due to the current diversion to the one or to the other differential input stage, these stages are activated in such a manner that a linear operation is ensured within the entire common-mode input voltage range.

In preferred manner, one level-shifting emitter follower each is connected between the base terminals of the transistors belonging to the transistor pair of the other differential input stage, and the two comparator inputs. The effect achieved thereby is that the common-mode input voltage can somewhat exceed the voltage value of the other pole of the supply voltage source, which may be by approx. 0.4 V when bipolar silicon transistors are used.

When a differential input stage in common-emitter connection is connected in parallel to a differential input stage in common-base connection, it is thus rendered possible that the admissible common-mode input voltage exceeds the supply voltage present at the supply voltage terminals, at the one end somewhat and at the other end by far.

In applications necessitating that the common-mode input voltage may exceed the supply voltage by far at both ends, it is possible to connect two differential input stages in parallel which each have a transistor pair in common-base connection.

The use of the comparator according to the invention is not restricted to the utilization in a switching current regulator for inductive load. It can be used in all cases in which, for whatever reasons, a common-mode input voltage must be possible which may exceed the supply voltage by far. The circuit according to the invention is also suited for a linear operational amplifier which must be able to operate at a common-mode input voltage that is much in excess of the supply voltage of said amplifier.

The circuit according to the invention may also be realized with CMOS technology or with a combined bipolar CMOS technology.

A differential input stage in common-base connection is known per se from Patents Abstracts of Japan, p-135, Aug. 17, 1982, Vol. 6/No. 156. This publication shows a voltage detection circuit and makes it possible to achieve stable detection at all times.

The invention will now be elucidated in more detail by way of an embodiment.

DETAILED DESCRIPTION OF THE PREFERRED EMBODIMENT

Figure 1:
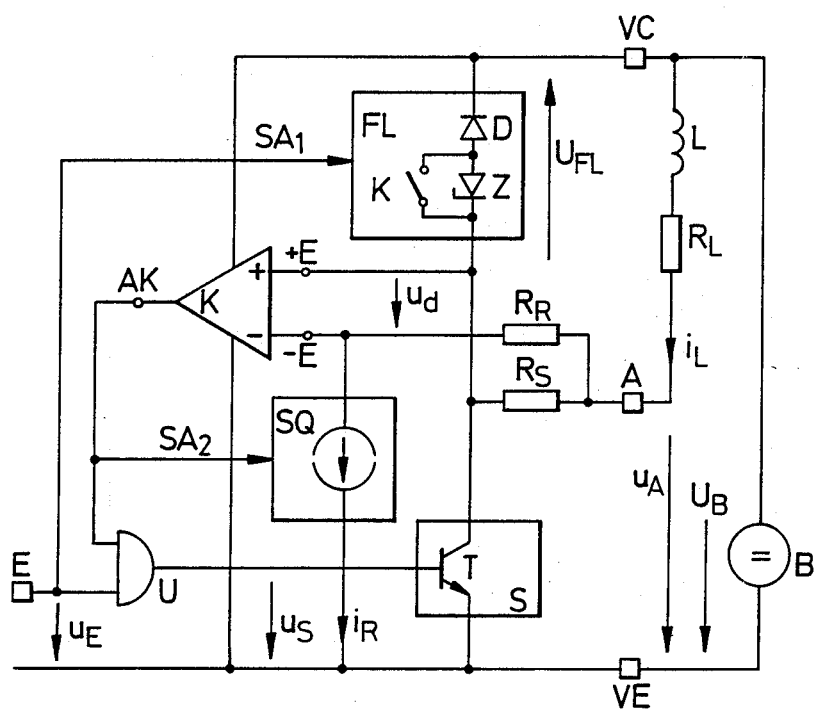
FIG. 1 a switching current regulator of the type described at the beginning.
Figure 2:
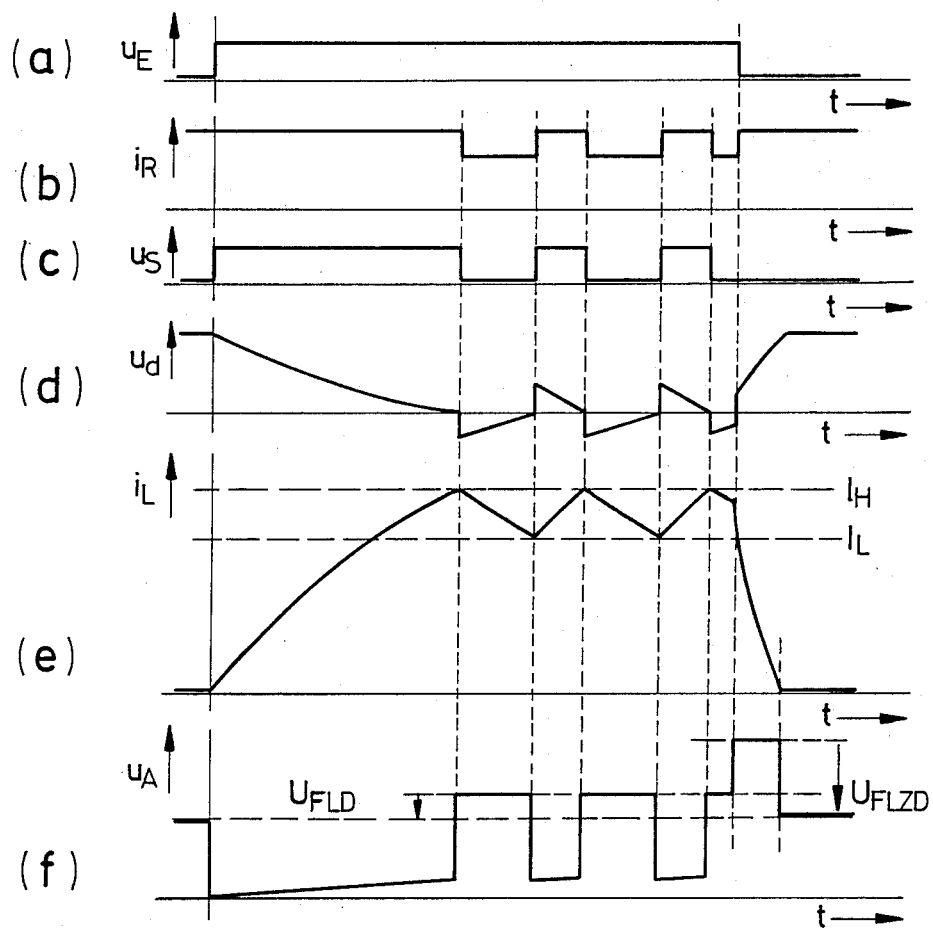
FIGS. 2a to 2f voltage and current patterns of the current regulator shown in FIG. 1.
Figure 3:
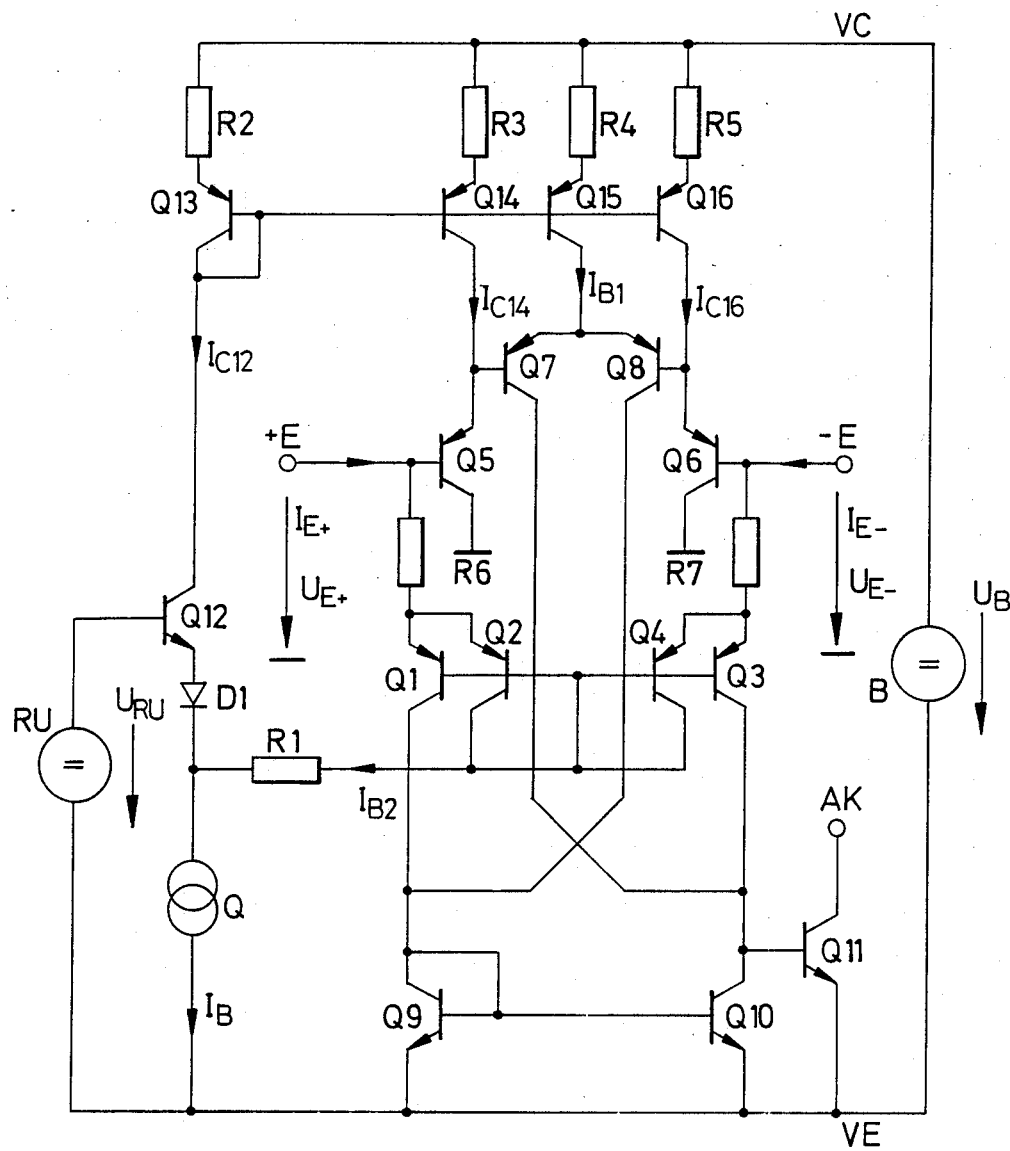
FIG. 3 an embodiment of a comparator or operational amplifier according to the invention.

The comparator depicted in FIG. 3 comprises a first differential input stage having a first transistor pair Q1, Q3 in common-base connection. Q1 and Q3 are pnp transistors having a common base terminal. The emitters of Q1 and Q3 are connected via resistors R6 and R7, respectively, to the non-inverting comparator input +E and to the inverting comparator input −E, respectively. In practical use, only one of these two resistors is required in general for compensating an error voltage arising at the inputs due to differring source resistances. The collector of Q1 is connected to the current input and the collector of Q3 is connected to the current output of a current mirror circuit Q9, Q10. The current output of the current mirror circuit Q9, Q10 has the base of a npn transistor Q11 connected thereto, the collector of said transistor forming the output terminal AK of the comparator.

The emitters of the transistors Q1 and Q3 have the emitters of pnp transistors Q2 and Q4, respectively, connected thereto, which are connected as diodes and whose base terminals and collector terminals are each connected to the common base terminal of the transistors Q1 and Q3. This common base terminal is connected via a resistor R1 on the one hand to the one end of a constant current source $Q_B$ having its other end connected to the ground terminal VE, and on the other hand to the cathode of a diode D1. The latter is arranged in series connection with the collector-to-emitter path of a transistor Q12 whose base is connected to the ground terminal VE via a switching reference voltage source RU.

Transistors Q13, Q14, Q15, Q16 and resistors R2, R3, R4, R5 constitute a current mirror having one current input and three current outputs. The collector of Q12 is connected to the current input of this current mirror.

A second differential input stage comprises a pair of pnp transistors Q7, Q8 in common-emitter connection. The common emitter terminal thereof is connected to the current output of the current mirror that is formed by Q15. The collectors of the transistors Q7 and Q8 are connected to the current output and the current input of the current mirror circuit Q9, Q10, respectively. The base of the transistor Q7 is connected on the one hand to the ground terminal VE via the collector-to-emitter path of a first pnp level-shifting emitter follower Q5 and on the other hand to the current output of the current mirror Q13 to Q16 that is formed by Q14. In similar manner the base of the transistor Q8 is connected on the one hand to the ground terminal VE via a second pnp level shifting emitter follower Q6 and on the other hand to the current output of the current mirror Q13 to Q16 that is formed by Q16. The base terminals of the level shifting emitter followers Q5 and Q6 are connected to the non-inverting input +E and to the inverting input −E, respectively.

The interconnections of the transistors Q1, Q2 and Q3, Q4, in which the transistors Q2 and Q4 connected so as to operate as diodes are connected in parallel to the base-to-emitter paths of the transistors Q1 and Q3, respectively, each constitute an equivalent transistor having a defined current amplification or gain.

It is possible with this circuit to determine the total current of the differential input stage Q1 to Q4 by means of the bias current $I_{B2}$.

The basic principle of this comparator circuit resides in that the two differential input stages connected in parallel and including the transistors Q1 to Q4 and the transistors Q5 to Q8, respectively, make use of the same current mirror circuit Q9, Q10 and the transistor Q11 serving as output amplifier or output switch. In doing so, a bias current $I_B$ delivered from the constant current source $Q_B$ is passed with the aid of the transistor Q12 and the diode D1 to the one or to the other differential input stage, depending on the ratio between the common-mode input voltage and the switching reference voltage $U_{RU}$. In a taking-over range of the common-mode input voltage both differential input stages are active. In this taking-over range the bias current $I_B$ divides into a bias current $I_{B2}$ for the first differential input stage and into a bias current $I_{C12}$ for the second differential input stage. This taking-over range can be dimensioned with the aid of the resistor R1.

On the condition that the differential input voltage $$U_d = U_{E+} - U_{E-}$$

is much smaller than the common-mode input voltage $V_{CM}$, i.e.

$$U_d << U_{CM}, \quad (1)$$

one obtains the result that $$U_{E+} \approx U_{CM} \quad (2)$$

and $$U_{E-} \approx U_{CM}. \quad (3)$$

When $$U_{CM} < U_{RU} - U_{BE12},$$

with $U_{BE12}$ being the base-emitter voltage of the transistor Q12, the transistors Q2 and Q4 connected so as to operate as diodes are blocked, so the $I_{B2}=0$. For, in neglection of the voltage drops across the resistors R1 and R6, one arrives at the following when Kirchhoff's second law is applied:

$$U_{BE2} = U_{CM} - U_{RU} + U_{BE12} + U_{D1}. \quad (4)$$

In this equation, $U_{D1}$ is the forward voltage of the diode D1.
When $$U_{CM} = U_{RU} - U_{BE12}, \quad (5)$$

$$U_{BE2} = U_{D1}. \quad (6)$$

When $$U_{CM} < U_{RU} - U_{BE12}, \quad (7)$$

$$U_{BE2} < U_{D1}. \quad (8)$$

Due to the fact that in practical application, especially in integrated circuits, the forward voltage of a diode is equal to the base-emitter forward voltage of a transistor, the voltage occurring across the base-emitter diode of the transistor Q2 is in this case below the base-emitter forward voltage so that the transistor Q2 is blocked. On the conditions (1) to (3), the same applies for the transistors Q1, Q3 and Q4.

As a consequence thereof, the bias current $I_B$ is supplied as collector current $I_{C12}$ to the current mirror Q13 to Q16. This current mirror is used to define the bias current $I_{B1}$ of the differential stage Q7, Q8 and to produce the emitter currents of the potential shifting emitter followers Q5 and Q6.

Applying Kirchhoff's second law, the following results for the inverting input terminal $-E$:

$$U_{CM} + U_{BE6} + U_{BE8} - U_{CE8} - U_{BE9} = 0, \quad (9)$$

wherein $U_{BE6}$, $U_{BE8}$ and $U_{BE9}$ are the base-emitter forward voltages of the transistors Q6, Q8 and Q9, respectively; $U_{CE8}$ is the collector-emitter voltage of the transistor Q8.

When the base-emitter forward voltages of all of these transistors are set to be $U_{BE}$, the result obtained is that $$U_{CE8} = U_{CM} + U_{BE}. \quad (10)$$

When assuming that $U_{BE} = 0.6$ V and that the saturation limit $U_{CE8} = 0.2$ V, the common-mode input voltage $U_{CM}$ may drop as low as $-0.4$ V with respect to the ground terminal VE before the transistors Q7, Q8 would reach the saturated state and the second differential input stage would enter into the non-linear range.

In the range of the common-mode input voltage less than $U_{RU} - U_{BE12}$ the transconductance or steepness of the comparator is determined by the steepness of the differential stage Q7, Q8 including the current mirror circuit Q9, Q10 and by the current gain of the transistor Q11. This steepness is directly proportional to the bias current $I_B$ and can be influenced by the current ratio $I_{B1}/I_{C12}$ of the current mirror Q15, Q13.

At a common-mode input voltage $$U_{CM} > U_{RU} - U_{BE12} \quad (11)$$

the base-to-emitter paths of the transistors Q1 to Q4 are biased in forward direction. The current $I_B$ of the current source $Q_B$ is therefore taken over by the conducting transistors Q2, Q4. The bias current $I_{B2}$ of the differential stage including the transistors Q1 to Q4 then becomes $I_{B2} = I_B$. In disregard of the voltage drop across R1 and when applying Kirchhoff's second law, the following results for the voltage $U_{D1}$ across the diode D1:

$$U_{D1} = U_{RU} - U_{CM} - U_{BE12} + U_{BE2}. \quad (12)$$

From this results for the case that $$U_{CM} > U_{RU} - U_{BE12}, \quad (13)$$

there is a voltage $$U_{D1} < U_{BE12} \quad (14)$$

across the diode D1.

This means that the voltage across the diode becomes lower than the base-emitter forward voltage and, thus, lower than the diode forward voltage. As a consequence thereof, the diode D1 is blocked and, thus, the transistor Q12 is blocked as well, so that $I_{C12}$ and, as a result thereof, the bias current $I_{B1}$ of the transistor pair Q7, Q8 become zero.

The diode D1 should have a high reverse voltage in order to prevent an emitter-base breakdown of the transistor Q12 at high common-mode input voltages.

In the upper common-mode input voltage range greater than $U_{RU}-U_{BE12}$, the first differential input stage including the transistors Q1 to Q4, thus, is in operation. In this respect, the common-mode input voltage constitutes the supply voltage of the differential input stage including the transistors Q1, Q2 and Q3, Q4 in common-base connection. This voltage may exceed the supply voltage $U_B$ at the supply voltage terminal VC, since non-linearities due to saturation effects cannot occur.

In this upper common-mode input voltage range, the transconductance or steepness of the comparator is determined by the steepness of the differential input stage Q1 to Q4 including the current mirror circuit Q9, Q10 and by the current gain of the transistor Q11. This steepness is also proportional to the current $I_B$ and can be influenced by the ratio of the emitter areas of the transistors Q1, Q2 and Q3, Q4.

When the circuit according to the invention is used as a linear operational amplifier, the steepnesses of the two differential input stages can be made equal to each other by selection of the current ratio $I_{B1}/I_{C12}$ and/or by selection of the ratio of the emitter areas of the transistors Q1, Q2 and Q3, Q4. This is not necessary for operating the circuit according to the invention as a comparator.

Figure 4:
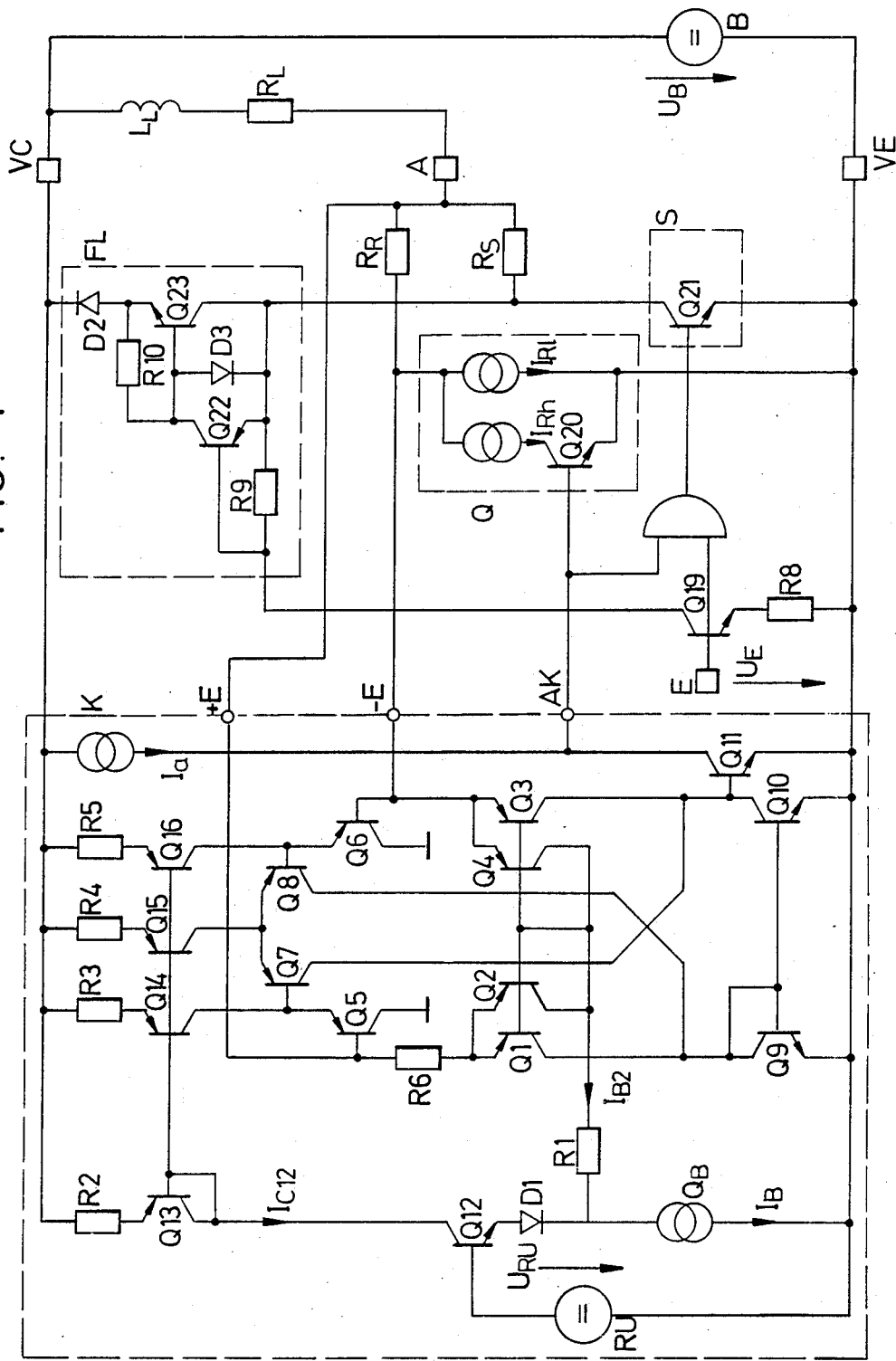
FIG. 4 a first embodiment of the current regulator comprising a comparator according to the invention.

In the current regulator shown in FIG. 4, the error voltage produced by the input current at the different input source resistors $R_R$ and $R_S$, can be compensated with the voltage drop resulting at the resistor R6.

Figure 5:
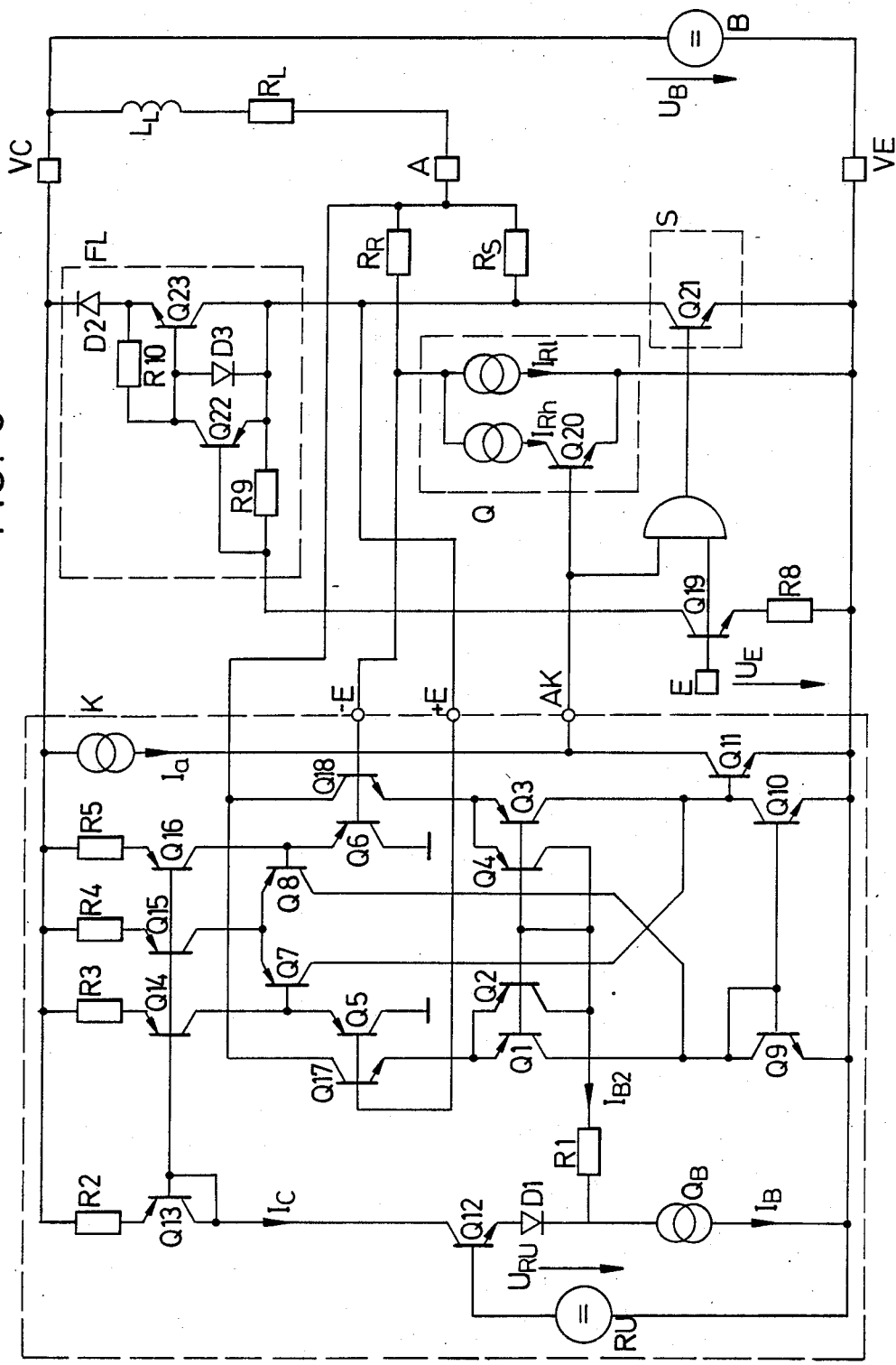
FIG. 5 a second embodiment of the current regulator comprising a comparator according to the invention.

Another possibility of reducing the error voltage consists in that, according to FIG. 5, the input current of the differential state operating in common-base connection is reduced by connecting two emitter followers Q17, Q18 upstream thereof. A precondition therefor is that the collectors of these emitter followers Q17, Q18 can be fed directly from the signal source.

With a circuit design complementary to that illustrated in FIG. 3, it is possible to realize a comparator circuit having a common-mode input voltage range which has a scope extending from highly negative voltages with respect to the ground terminal VE as far as somewhat above the supply voltage at the supply voltage terminal VC. With such a comparator it would be possible to build a two-point current regulator which regulates current in an inductive load with a connection to ground.

What is claimed is:

1. A comparator comprising:
    two comparator inputs;
    two differential input stages connected in parallel, each of said two differential input stages being connected to receive a voltage from a common-mode input voltage source coupled to each of the two comparator inputs;
    a common constant current source connected to each of said two differential input stages;
    a supply voltage source having two poles connected to said comparator;
    said constant current source being connected to feed current to at least one of both of said two differential input stages, depending upon the relationship between said common-mode input voltage and said supply voltage; and
    a first current mirror circuit connected downstream of the outputs of both differential input stages and from which the output of said comparator is derived,
    wherein at least one of said two differential input stages operates in a common-base connection and receives its emitter supply current from said common input voltage source.

2. A comparator according to claim 1, wherein the first of said two differential input stages operates in common-base connection and the second of said two differential input stages operates in common-emitter connection.

3. A comparator according to claim 2, wherein an emitter follower stage is connected upstream of the inputs of at least one of the two differential input stages.

4. A comparator according to claim 2, said comparator further comprising inverting and non-inverting comparator inputs and said first current mirror circuit connected to said two differential input stages has a current input and a current output, and wherein each of said two differential input stages comprise a transistor pair;
    a first transistor of the transistor pair of the second of said two differential input stages is connected between said inverting comparator input and said current input of the first current mirror circuit;
    a first transistor of the transistor pair of the first of said two differential input stages is connected between said non-inverting input and said current input of the first current mirror circuit;
    a second transistor of the transistor pair of the second of said two differential input stages is connected between said non-inverting comparator input and said current output of the first current mirror circuit; and
    a second transistor of the transistor pair of the first of said two differential input stages is connected between said inverting comparator input and said current output of the first current mirror circuit.

5. A comparator according to claim 1, further including a switching reference voltage source connected to said comparator, wherein the common constant current source is connected to each differential input stage by means of a current diversion circuit, and the current conducted to each differential input stage is dependent on the ratio of the common-mode input voltage to the switching reference voltage.

6. A comparator according to claim 5, further including a second current mirror circuit connected to said second of said two differential input stages and wherein said current diversion circuit includes a switching transistor having its collector-to-emitter path connected in series with said common constant current source and whose base is biased by said switching reference voltage source, said switching transistor having its emitter connected by means of a diode to a common base connection of a transistor of the first differential input stage, and said switching transistor having its collector connected to said second current mirror circuit, so that said common constant current source, based upon the ratio between the values of said common-mode input voltage and said switching reference voltage, feeds at least one of both of said two differential input stages by means of said second current mirror circuit.

7. A comparator according to claim 2, further including a current diversion circuit which connects said common constant current source to said two differential input stages, and wherein the first differential input stage comprises a pnp transistor pair whose emitters are each connected to one of the two comparator inputs, whose collectors are connected to the current input and the current output, respectively, of the first current mirror circuit, and whose common base terminal is connected to said current diversion circuit.

8. A comparator according to claim 2, wherein the emitter-to-base paths of the two transistors of the transistor pair of the first differential input stage each have a diode connected in parallel thereto, which has the same polarity as the base-to-emitter path of the associated transistor.

9. A comparator according to claim 8, wherein the two diodes are each formed by a transistor connected as a diode and having the same conductivity type as the associated transistor of the first differential input stage transistor pair.

10. A comparator according to claim 8, wherein a diode is connected between a common base terminal of the first differential input stage and the switching transistor.

11. A comparator according to claim 7, wherein a compensating resistor is connected at least between one of the comparator inputs and the emitter of the associated transistor.

12. A comparator according to claim 1, wherein the second differential input stage comprises a pnp transistor pair in common-emitter connection.

13. A comparator according to claim 6, further including two emitter follower stages, each connected to receive an output from said second current mirror circuit; and wherein said second current mirror circuit comprises a current input connected to the current diversion circuit, and three current outputs of which one is connected to the common emitter terminal of the transistor pair of the second differential input stage and the other two outputs are each connected to the emitter of one of the two emitter follower stages.

14. A comparator according to claim 1, wherein the current output of the first current mirror circuit has the base of an output transistor connected thereto and the collector thereof forms the comparator output.

15. A comparator according to claim 1, wherein said comparator includes at least one of MOS transistors and JFET's.

16. A switching current regulator for driving an inductive load, including:
a comparator comprising:
two comparator inputs;
two differential input stages connected in parallel, each of said two differential input stages being connected to receive a voltage from a common-mode input voltage source coupled to each of said two comparator inputs;
a common constant current source connected to each of said two differential input stages;
a supply voltage source having two poles connected to said comparator;
said constant current source being connected to feed current to at least one of both of said two differential input stages, depending upon the relationship between said common-mode input voltage and said supply voltage; and
a first current mirror circuit connected downstream of the outputs of both differential input stages and from which the output of said comparator is derived,
wherein at least one of said two differential input stages operates in a common-base connection and receives its emitter supply current from said common-mode input voltage source;
said switching regulator further including:
flyback circuit means connected in series to a controllable switch, said flyback circuit means and series connected controllable switch being connected in parallel across said two poles of said supply voltage source;
said inductive load connected in series with a current sensing means and in parallel to said flyback circuit means, said current sensing means producing a current sensing signal representative of the current flowing through said inductive load;
said controllable switch being controlled by the output of said comparator;
a reference signal source connected to said comparator for producing a reference signal such that said comparator compares said current sensing signal to said reference signal and causes said controllable switch to be activated each time said current sensing signal reaches said reference signal value; and
said reference signal source being switchable between a high reference signal value which, when reached by said current sensing signal, said comparator effects an interruption of the previously conducting controllable switch and a low reference signal value which, when reached by said current sensing signal, said comparator effects switching of said controllable switch into a conducting state from the previously interrupted state.

* * * * *